(12) United States Patent
Yoshida et al.

(10) Patent No.: US 11,049,856 B2
(45) Date of Patent: Jun. 29, 2021

(54) SEMICONDUCTOR DEVICE

(71) Applicant: PANASONIC SEMICONDUCTOR SOLUTIONS CO., LTD., Nagaokakyo (JP)

(72) Inventors: Kazuma Yoshida, Kyoto (JP); Ryosuke Okawa, Nara (JP); Tsubasa Inoue, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 21 days.

(21) Appl. No.: 16/488,541

(22) PCT Filed: Jan. 25, 2019

(86) PCT No.: PCT/JP2019/002567
§ 371 (c)(1),
(2) Date: Aug. 23, 2019

(87) PCT Pub. No.: WO2019/244387
PCT Pub. Date: Dec. 26, 2019

(65) Prior Publication Data
US 2020/0388609 A1 Dec. 10, 2020

Related U.S. Application Data

(60) Provisional application No. 62/687,035, filed on Jun. 19, 2018.

(51) Int. Cl.
*H01L 27/06* (2006.01)
*H01C 1/08* (2006.01)
(Continued)

(52) U.S. Cl.
CPC ........... *H01L 27/0629* (2013.01); *H01C 1/08* (2013.01); *H01C 13/00* (2013.01);
(Continued)

(58) Field of Classification Search
CPC ............. H01L 27/0629; H01L 23/3114; H01L 23/528; H01L 23/7827
See application file for complete search history.

(56) References Cited

U.S. PATENT DOCUMENTS 9,401,358 B1\* 7/2016 Hung ................ H01L 27/0629
2008/0265314 A1 10/2008 Kobayashi
(Continued)

FOREIGN PATENT DOCUMENTS

| JP | 2008-277365 A | 11/2008 |
|---|---|---|
| JP | 2012-119577 A | 6/2012 |
| WO | 2015/166654 A1 | 11/2015 |

OTHER PUBLICATIONS

International Search Report issued in corresponding International Patent Application No. PCT/JP2019/002567, dated Apr. 23, 2019.
(Continued)

*Primary Examiner* — Marc Anthony Armand
(74) *Attorney, Agent, or Firm* — McDermott Will & Emery LLP

(57) ABSTRACT

Provided is a semiconductor device which is a facedown mounting, chip-size-package-type semiconductor device and includes: a transistor element including a first electrode, a second electrode, and a control electrode which controls a conduction state between the first electrode and the second electrode; a plurality of first resistor elements each including a first electrode and a second electrode, the first electrodes of the first resistor elements being electrically connected to the second electrode of the transistor element; one or more external resistance terminals to which the second electrodes of the plurality of first resistor elements are physically connected; a first external terminal electrically connected to the first electrode of the transistor element; and an external control terminal electrically connected to the control electrode. The one or more external resistance terminals, the first
(Continued)

external terminal, and the external control terminal are external connection terminals provided on a surface of the semiconductor device.

22 Claims, 12 Drawing Sheets

(51) Int. Cl.
    *H01C 13/00*     (2006.01)
    *H01L 21/8234*     (2006.01)
    *H01L 23/31*     (2006.01)
    *H01L 23/528*     (2006.01)
    *H01L 29/78*     (2006.01)

(52) U.S. Cl.
    CPC .. *H01L 21/823487* (2013.01); *H01L 23/3114* (2013.01); *H01L 23/528* (2013.01); *H01L 29/7827* (2013.01)

(56) References Cited

U.S. PATENT DOCUMENTS

| | | | | |
|---|---|---|---|---|
| 2013/0314165 A1* | 11/2013 | Tsutsumi | ............ | H01L 27/0629 331/34 |
| 2013/0328131 A1* | 12/2013 | Lu | ....................... | H01L 27/0688 257/379 |
| 2013/0328619 A1* | 12/2013 | Karino | .................... | G05F 1/462 327/537 |
| 2016/0372460 A1* | 12/2016 | Momota | ............. | H01L 29/7395 |
| 2017/0040824 A1 | 2/2017 | Yasuda et al. | | |
| 2017/0330876 A1* | 11/2017 | Leedy | ................. | H01L 27/1446 |
| 2019/0319126 A1* | 10/2019 | Matsushima | ......... | H01L 23/562 |

OTHER PUBLICATIONS

Written Opinion of the International Searching Authority issued in corresponding International Patent Application No. PCT/JP2019/002567, dated Apr. 23, 2019.

Chinese Office Action issued in corresponding Chinese Patent Application No. 20198001546.8, dated Dec. 8, 2020, with English translation of Search Report.

"From introduction to mastery of the electronic component detection and maintenance," with partial English translation.

* cited by examiner

FIG. 17

|  | SINGLE LAYER, 6.16 (W) | THREE LAYERS, 7.04 (W) | THREE LAYERS, 9.02 (W) |  |
|---|---|---|---|---|
|  | 2.20 | 1.94 | 3.05 | V (mm³) |
| Z (mm) | 2.0 | 2.0 | 2.0 | Y (mm) |
| 0.10 | 11.0 | 9.7 | 15.3 | |
| 0.15 | 7.3 | 6.5 | 10.2 | |
| 0.20 | 5.5 | 4.9 | 7.6 | |
| 0.25 | 4.4 | 3.9 | 6.1 | |
| 0.30 | 3.7 | 3.2 | 5.1 | X (mm) |
| 0.35 | 3.1 | 2.8 | 4.4 | |
| 0.40 | 2.8 | 2.4 | 3.8 | |
| 0.45 | 2.4 | 2.2 | 3.4 | |
| 0.50 | 2.2 | 1.9 | 3.1 | |

SEMICONDUCTOR DEVICE

CROSS-REFERENCE OF RELATED APPLICATIONS

This application is the U.S. National Phase under 35 U.S.C. § 371 of International Patent Application No. PCT/JP2019/002567, filed on Jan. 25, 2019, which in turn claims the benefit of U.S. application Ser. No. 62/687,035, filed on Jun. 19, 2018, the entire disclosures of which Applications are incorporated by reference herein.

TECHNICAL FIELD

The present disclosure relates to a semiconductor device, and relates in particular to a chip-size-package (CSP) type semiconductor device.

BACKGROUND ART

A conventional semiconductor device for discharge control is known which includes one transistor element and one resistor element that limits discharge current (see Patent Literature (PTL) 1, for example).

CITATION LIST

Patent Literature

PTL 1: PCT International Publication WO 2015/166654

SUMMARY OF THE INVENTION

Technical Problems

Since the above-described conventional semiconductor device includes only one resistor element for discharge current control, at the time of discharge control, heat is generated only in the local region in the semiconductor device where the resistor element is disposed. In such a case, the temperature of the local region may exceed the allowable operating temperature of the semiconductor device, and cause breakdown of the semiconductor device. Even in dissipating the generated heat, it is not easy to transfer the heat generated in the local region to the surrounding region, and the heat is thus not dissipated efficiently.

In view of the above circumstances, an object of the present disclosure is to provide a semiconductor device capable of achieving a greater reduction, as compared to the conventional technique, in the maximum temperature of heat generated by resistor elements at the time of discharge control, and dissipating heat more efficiently than the conventional technique.

Solution to Problems

A semiconductor device according to the present disclosure is semiconductor device which is a facedown mounting, chip-size-package-type semiconductor device. The semiconductor device includes: a transistor element including a first electrode, a second electrode, and a control electrode which controls a conduction state between the first electrode and the second electrode; a plurality of first resistor elements each of which includes a first electrode and a second electrode, the first electrodes of the plurality of first resistor elements being electrically connected to the second electrode of the transistor element; one or more external resistance terminals to which the second electrodes of the plurality of first resistor elements are physically connected; a first external terminal electrically connected to the first electrode of the transistor element; and an external control terminal electrically connected to the control electrode. The one or more external resistance terminals, the first external terminal, and the external control terminal are external connection terminals provided on a surface of the semiconductor device.

According to this configuration, since a plurality of first resistor elements, which are heat sources, are arranged in parallel, heat generated at the time of discharge control can be dispersed to the positions of the plurality of first resistor elements, and it is possible to achieve a greater reduction, as compared to the conventional technique, in the maximum temperature of heat generated in each of the first resistor elements. Accordingly, at the time of discharge control, heat generated in the semiconductor device can be dissipated more efficiently than the conventional technique, and breakdown of the semiconductor device can be prevented.

Advantageous Effect of Invention

With a semiconductor device according to the present disclosure, at the time of discharge control, heat generated in the semiconductor device can be dissipated more efficiently than the conventional technique, and breakdown of the semiconductor device can be prevented.

BRIEF DESCRIPTION OF DRAWINGS

FIG. 17 illustrates a relationship among the length of each side and the volume when a semiconductor device according to the embodiment satisfies a predetermined temperature condition.

DESCRIPTION OF EXEMPLARY EMBODIMENT

The embodiment described below illustrates a specific example of the present disclosure. The numerical values, shapes, materials, elements, the arrangement and connection of the elements, etc., indicated in the following embodiment are mere examples, and therefore do not intend to limit the present disclosure. Among the elements in the following embodiment, those not recited in any of the independent claims representing the broadest inventive concepts are described as optional elements.

In the present disclosure, the terminology "A and B are electrically connected" includes configurations in which A and B are directly connected via a wire, configurations in which A and B are directly connected without a wire, and configurations in which A and B are indirectly connected via a resistive component (a resistor element or a resistive wire).

Embodiment <Configuration including vertical MOS transistor>

The following describes a configuration of semiconductor device 1 according to the present embodiment. Semiconductor device 1 is a chip-size-package-type semiconductor device which internally includes one vertical metal oxide semiconductor (MOS) transistor and a plurality of resistor elements, and may be a chip-size-package-type semiconductor device of a ball grid array (BGA) type, a land grid array (LGA) type, or other types.

The vertical MOS transistor is a power transistor, and is also known as a trench MOS field effect transistor (FET).

Figure 1:
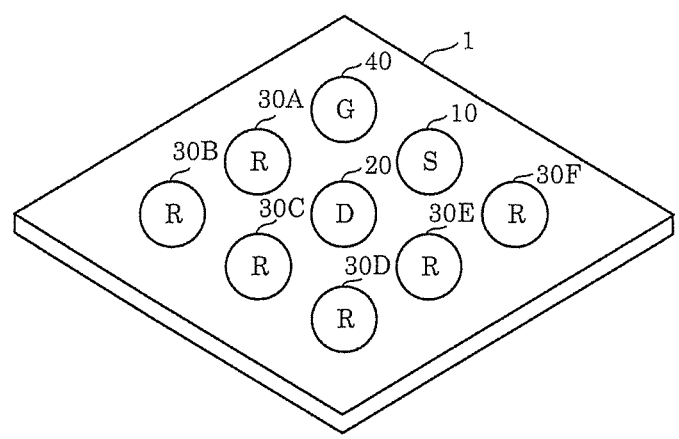
FIG. 1 is an external view of a semiconductor device according to an embodiment.

FIG. 1 is an external view of semiconductor device 1.

As illustrated in FIG. 1, semiconductor device 1 includes, on its surface, first external terminal 10, second external terminal 20, external resistance terminals 30A to 30F (hereinafter also referred to as external resistance terminals 30), and external control terminal 40 as external connection terminals. Semiconductor device 1 is facedown mounted, so that the external connection terminals described above are bonded to the mounting surface of the mounting substrate.

Figure 2:
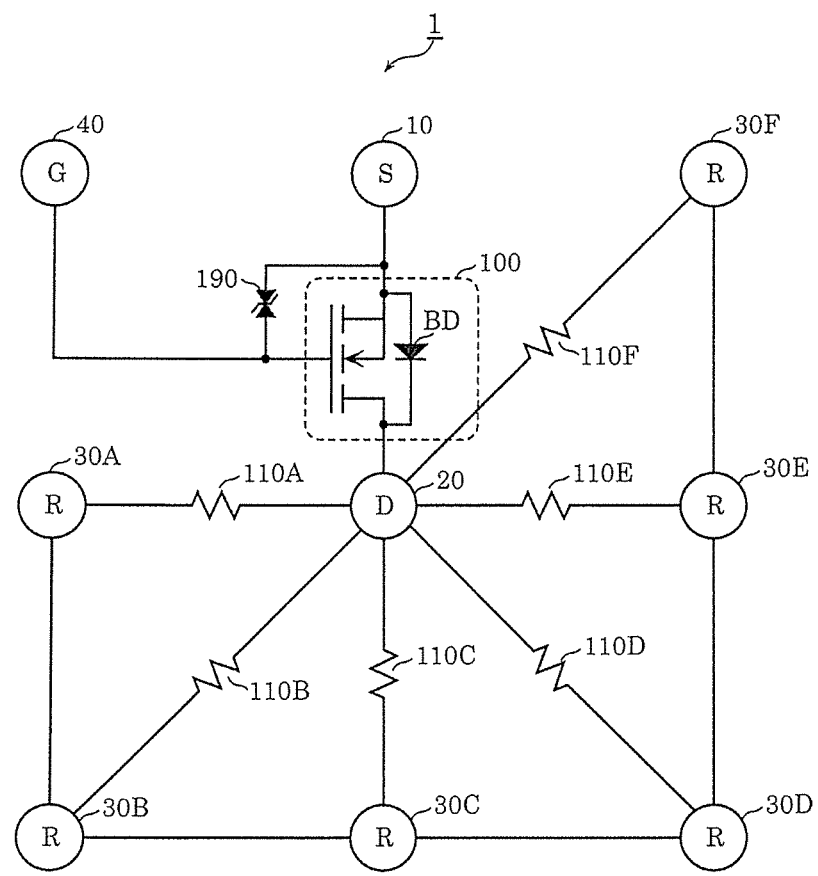
FIG. 2 is a circuit diagram of a semiconductor device according to the embodiment.

FIG. 2 is a circuit diagram of semiconductor device 1.

As illustrated in FIG. 2, semiconductor device 1 includes, in addition to the external connection terminals described above, transistor element 100 which is a vertical MOS transistor, first resistor elements 110A to 110F (hereinafter also referred to as first resistor elements 110), and Zener diode 190 for ESD protection. Transistor element 100 includes body diode BD as a parasitic element between the source and the drain.

A first electrode of each of first resistor elements 110 is electrically connected to second external terminal 20. First resistor elements 110 correspond one-to-one with external resistance terminals 30. A second electrode of each of first resistor elements 110 is electrically connected to a corresponding one of external resistance terminals 30. The second electrodes of first resistor elements 110 may be electrically short-circuited to each other.

Figure 3:
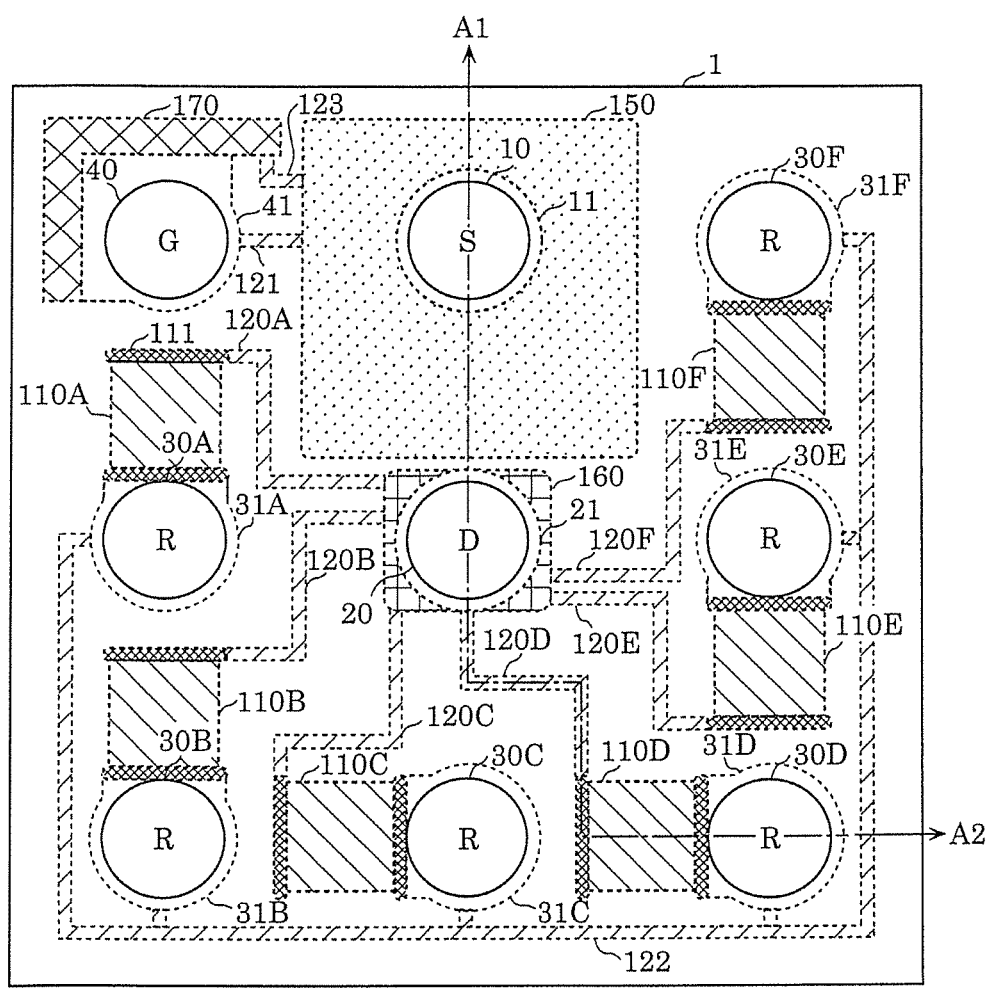
FIG. 3 is a top transparent view of a semiconductor device according to the embodiment.
Figure 4:
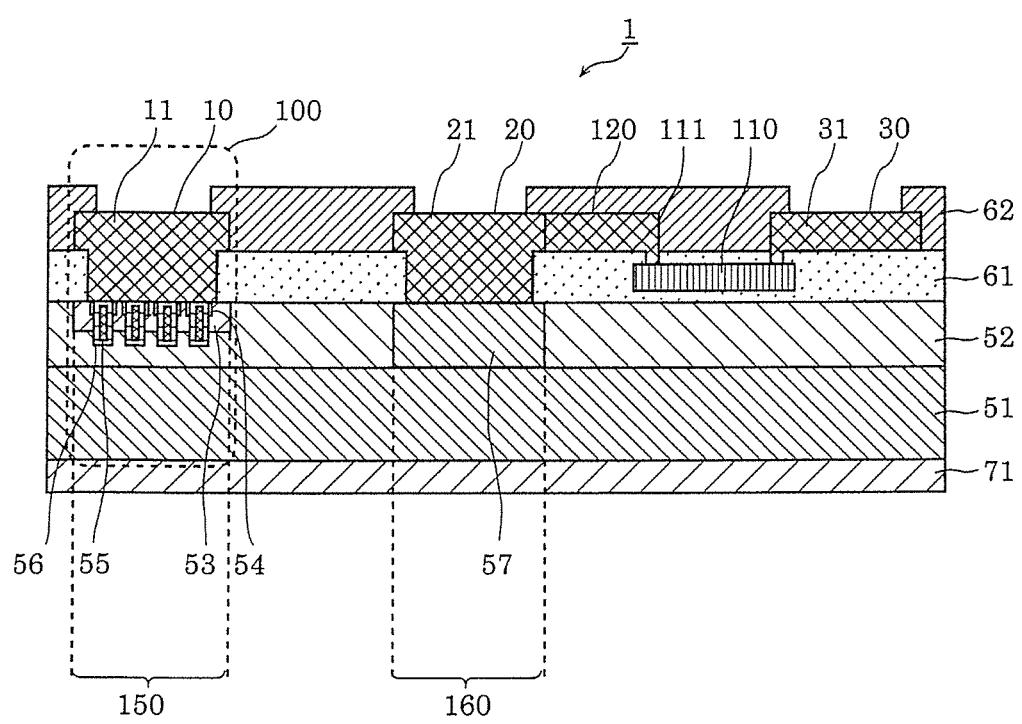
FIG. 4 is a cross-sectional view of a semiconductor device according to the embodiment.

FIG. 3 is a top transparent view of semiconductor device 1, and FIG. 4 is a cross-sectional view of semiconductor device 1 illustrating the plane taken along line A1-A2 in FIG. 3.

The following describes an internal configuration of semiconductor device 1 with reference to FIG. 3 and FIG. 4.

As illustrated in FIG. 4 and FIG. 3, semiconductor device 1 includes semiconductor substrate 51, first low-concentration impurity layer 52, high-concentration impurity layer 57, insulating layer 61, passivation layer 62, metal layer 71, transistor element 100, drain external electrode 21, resistance electrodes 31, first resistor elements 110, and metal wires 120 to 123.

Semiconductor substrate 51 comprises silicon containing an impurity of a first conductivity type, and may be, for example, an N-type silicon substrate. Here, the first conductivity type is N-type and the second conductivity type is P-type.

First low-concentration impurity layer 52 is formed in contact with the top surface (the upper main surface in FIG. 4) of semiconductor substrate 51, and contains an impurity of the first conductivity type in a lower concentration than the concentration of the impurity of the first conductivity type in semiconductor substrate 51. First low-concentration impurity layer 52 may be formed on semiconductor substrate 51 in an epitaxial growth process, for example.

High-concentration impurity layer 57 is formed in contact with the top surface of semiconductor substrate 51, and contains an impurity of the first conductivity type in a higher concentration than the concentration of the impurity of the first conductivity type in first low-concentration impurity layer 52. High-concentration impurity layer 57 is formed in drain lead-out region 160 of first low-concentration impurity layer 52. High-concentration impurity layer 57 may be formed by implanting an impurity of the first conductivity type into drain lead-out region 160.

It should be noted that high-concentration impurity layer 57 is not essential in semiconductor device 1, and may be replaced with first low-concentration impurity layer 52, in which case additional implantation of an impurity of the first conductivity type is unnecessary, thus enabling reduction in the manufacturing cost of semiconductor device 1.

Insulating layer 61 is formed in contact with the top surface of first low-concentration impurity layer 52. Insulating layer 61 may comprise silicon dioxide, and may be formed using a chemical vapor deposition (CVD) method.

Passivation layer 62 is a protective layer formed at the surface of semiconductor device 1. Passivation layer 62 may comprise silicon nitride, and may be formed using a CVD method.

Metal layer 71 is formed in contact with the bottom surface (the lower main surface in FIG. 4) of semiconductor substrate 51, and is formed using a metal material.

Transistor element 100 is formed in transistor element region 150, and includes: first electrode 11 (hereinafter also referred to as a source electrode) which serves as a source electrode; semiconductor substrate 51 (hereinafter also referred to as a drain electrode) which serves as a drain electrode; and gate conductors 55 which serve as a control electrode that controls a conduction state between first electrode 11 (source electrode) and semiconductor substrate 51 (drain electrode).

Body region 53 containing an impurity of a second conductivity type that is different from the first conductivity type is formed in first low-concentration impurity layer 52 in transistor element region 150. Source regions 54 containing an impurity of the first conductivity type, gate conductors 55, and gate insulating films 56 are formed in body region 53.

First electrode 11 is physically connected to source regions 54 and body region 53, and the top surface of first electrode 11 is exposed as first external terminal 10 at the surface of semiconductor device 1 through an opening in passivation layer 62.

Drain external electrode 21 is physically connected to high-concentration impurity layer 57, and the top surface of drain external electrode 21 is exposed as second external terminal 20 at the surface of semiconductor device 1 through an opening in passivation layer 62.

Resistance electrodes 31 (31A to 31F) are physically connected to the second electrodes of first resistor elements 110 (110A to 110F), and the top surfaces of resistance electrodes 31 are exposed as external resistance terminals 30 (30A to 30F) at the surface of semiconductor device 1 through openings in passivation layer 62. Here, resistance electrodes 31, first resistor elements 110, and external resistance terminals 30 are plural in number, and correspond one-to-one with each other. Resistance electrodes 31 may be electrically connected to each other through metal wire 122.

Third electrode 41 (see FIG. 3) (hereinafter also referred to as a gate electrode) is electrically connected to gate conductors 55 (see FIG. 4) through metal wire 121 (see FIG. 3). The top surface of third electrode 41 is exposed as external control terminal 40 at the surface of semiconductor device 1 through an opening in passivation layer 62.

First resistor elements 110 are formed in insulating layer 61, and comprise polysilicon implanted with an impurity. First resistor elements 110 may be formed using a CVD method, for example. The sheet resistance of polysilicon can be determined based on the type and dose of the impurity, for example.

Metal wires 120 (120A to 120F) are formed on insulating layer 61, and electrically connect drain external electrode 21 with the first electrodes of first resistor elements 110 (110A to 110F).

Zener diode 190 is illustrated as Zener diode region 170 in FIG. 3, and includes one electrode electrically connected to first electrode 11 through metal wire 123 and the other electrode electrically connected to third electrode 41.

In one non-limiting example, first electrode 11, drain external electrode 21, resistance electrodes 31, third electrode 41, metal layer 71, and metal wires 120 to 123 may include a metal material containing at least one of aluminum, copper, gold, and silver.

Although semiconductor device 1 described above has a configuration in which the first conductivity type is N-type and the second conductivity type is P-type, the semiconductor devices according to the present embodiment are not limited to this configuration, and may have a configuration in which the first conductivity type is P-type and the second conductivity type is N-type. In that case, the forward direction of the body diode provided between the source and the drain as a parasitic element is opposite to the forward direction of body diode BD of semiconductor device 1. An impurity of the first conductivity type may be, for example, arsenic or phosphorus, and an impurity of the second conductivity type may be boron, for example.

In semiconductor device 1 described above, a total number of external resistance terminals 30 and a total number of resistance electrodes 31 are each identical to a total number of the plurality of first resistor elements 110. The semiconductor devices according to the present embodiment are not limited to this configuration, and may have a configuration in which, for the plurality of first resistor elements 110, at least one external resistance terminal 30 is provided and a total number of resistance electrodes 31 is less than or equal to a total number of external resistance terminals 30. For example, in the case of semiconductor device 1 described above (the total number of first resistor elements 110 is six), semiconductor device 1 may have a configuration in which the total number of external resistance terminals 30 is between one and five, inclusive, or at least seven, and the total number of resistance electrodes 31 is equal to or less than the total number of external resistance terminals 30. Here, it is sufficient so long as the second electrodes of first resistor elements 110 are each physically connected to one of resistance electrodes 31. Other than this example, FIG. 5, which is described later, illustrates, as an example, a total number relationship between first resistor elements 510A to 510J (hereinafter also referred to as resistor element 510), external resistance terminals 430A to 430E (hereinafter also referred to as external resistance terminal 430), and resistance electrodes 431A to 431C (hereinafter also referred to as resistance electrodes 431).

With semiconductor device 1 described above, the shape of external resistance terminals 30 is circular in a plan view of semiconductor device 1, but the resistance terminals of the semiconductor devices according to the present embodiment are not limited to being circular in shape, and may be oval or polygonal, for example.

With the above configuration, semiconductor device 1 can pass a conduction current from external resistance terminals 30 to first external terminal 10 when the potential of the gate electrode becomes greater than or equal to a threshold with respect to the potential of the source electrode, and transistor element 100 enters a conductive state (hereinafter also referred to as "at the time of current conduction"). The path of the conduction current is, in order from external resistance terminals 30 to first external terminal 10, resistance electrodes 31, first resistor elements 110, metal wires 120, drain external electrode 21, high-concentration impurity layer 57, semiconductor substrate 51, first low-concentration impurity layer 52, body region 53, source regions 54, and first electrode 11. At this time, since the current that flows through first resistor elements 110 is branched to each of the plurality of first resistor elements 110, the locations at which heat is generated at the time of current conduction are dispersed; heat is generated at the positions of first resistor elements 110. As a result, the maximum temperature of heat generated by each of the first resistor elements decreases according to the degree of branching of the conduction current. Therefore, semiconductor device 1 can reduce the maximum temperature of heat generated at the time of current conduction, and dissipate heat efficiently.

Regions in which first resistor elements 110 and metal wires 120 are physically connected and regions in which first resistor elements 110 and resistance electrodes 31 are physically connected are referred to as contacts 111, and are illustrated with common hatching in FIG. 3. Since the second electrodes of first resistor elements 110 are directly physically connected to resistance electrodes 31 at contacts 111, the heat generated by first resistor elements 110 can be transmitted to the mounting substrate via a heat conduction path of a metal material only, from resistance electrodes 31 including a metal material through external resistance terminals 30. Therefore, semiconductor device 1 can efficiently dissipate heat generated at the time of current conduction.

The second electrodes of first resistor elements 110 are electrically short-circuited to each other in semiconductor device 1. Therefore, according to semiconductor device 1, even when some of external resistance terminals 30 have open circuit faults in bonding to the mounting substrate due to a mounting failure or the like, a resistance value necessary for discharge control set between first external terminal 10 and external resistance terminals 30 is secured.

The resistance values of first resistor elements 110 are desirably identical. This equalizes the amounts of heat generated by first resistor elements 110, thus allowing the maximum temperatures of heat generated by first resistor elements to be uniform at a minimum value. Therefore, semiconductor device 1 can reduce the maximum temperature of heat generated at the time of current conduction, and dissipate heat efficiently. Here, having the identical resistance values means that the resistance values are the same within a range of variation in the quality resulting from the manufacturing process.

External resistance terminals 30 are radially disposed around second external terminal 20 in a plan view of semiconductor device 1. Here, radially disposed means that second external terminal 20 is disposed in an inner region and external resistance terminals 30 are disposed in an outer region in a plan view of semiconductor device 1. In this case, the heat generated by first resistor elements 110 is dispersed and dissipated from resistance electrodes 31, which are connected to first resistor elements 110 via contacts 111, to a larger surface area of the mounting substrate through external resistance terminals 30. This reduces accumulation of heat at a particular portion of semiconductor device 1. Therefore, semiconductor device 1 can efficiently dissipate heat generated at the time of current conduction. Other than this example, FIG. 5, which is described later, illustrates, as an example, a positional relationship between second external terminal 420 and external resistance terminals 430A to 430E (hereinafter also referred to as external resistance terminals 430).

A condition for the radial disposition is that at least half of the radially disposed elements (here, external resistance terminals 30) are radially disposed. The same condition applies to the radial disposition in the following description.

First resistor elements 110 are radially disposed around second external terminal 20 in the plan view of semiconductor device 1. With this configuration, heat is generated in the regions of first resistor elements 110 that are larger surface areas of semiconductor device 1, thus reducing accumulation of heat at a particular portion of semiconductor device 1. As a result, semiconductor device 1 can achieve a greater reduction, as compared to the conventional technique, of heat generated at the time of current conduction, and dissipate heat efficiently. Other than this example, FIG. 5, which is described later, illustrates, as an example, a positional relationship between second external terminal 420 and first resistor elements 510A to 510J (hereinafter also referred to as resistance terminals 510).

In the plan view of semiconductor device 1, the shortest distance between at least one external resistance terminal 30 and the outer periphery of semiconductor device 1 may be less than or equal to the shortest distance between the outer periphery of semiconductor device 1 and first resistor element 110 physically connected to resistance electrode 31 which includes the at least one external resistance terminal 30. This configuration reduces accumulation of heat in semiconductor device 1. As a result, semiconductor device 1 can efficiently dissipate heat generated at the time of current conduction.

In the plan view of semiconductor device 1, the shortest distance between the central point of at least one external resistance terminal 30 and the outer periphery of semiconductor device 1 may be less than or equal to the shortest distance between the outer periphery of semiconductor device 1 and the central point of first resistor element 110 physically connected to resistance electrode 31 which includes the at least one external resistance terminal 30. This configuration reduces accumulation of heat in semiconductor device 1. As a result, semiconductor device 1 can efficiently dissipate heat generated at the time of current conduction.

In the plan view of semiconductor device 1, second external terminal 20 is disposed closer to the central portion than the other external connection terminals are. (It is sufficient so long as the other external connection terminals are disposed around second external terminal 20.) When semiconductor device 1 is mounted to the mounting substrate by reflow soldering, chip warpage may occur in semiconductor device 1 due to heating in the reflow soldering. The chip warpage occurs due to the coefficient of thermal expansion of the metal included in metal layer 71 being greater than the coefficient of thermal expansion of silicon included in semiconductor substrate 51 and first low-concentration impurity layer 52, for example. The chip warps in the direction in which the central portion of semiconductor device 1 separates from the mounting substrate. As a result, external connection terminals disposed closer to the central portion of semiconductor device 1 are more susceptible to void faults at the portions bonding with the mounting substrate than external connection terminals disposed closer to the outer periphery. In some cases, second external terminal 20 is not used in an actual application circuit, as illustrated in an application circuit example in FIG. 15 described later. Therefore, second external terminal 20 is disposed closer to the central portion than the other external connection terminals are in the plan view of semiconductor device 1, so that when second external terminal 20 is not used in the application circuit, the actual damage as the application circuit can be eliminated even when, at the time of reflow soldering, void faults occur at the bonding portion of the external terminal disposed closer to the central portion of semiconductor device 1. Other than this example, FIG. 5, which is described later, illustrates, as an example, a positional relationship between second external terminal 420, first external terminals 410A and 410B, external control terminal 440, and external resistance terminals 430.

When the plurality of first resistor elements 110, which are heat sources, are disposed adjacent to independent external resistance terminals 30 in one-to-one correspondence, it is considered that the heat dissipation property is determined based on the relationship between a total number of external resistance terminals 30 included in the semiconductor device and a total number of first external terminal 10, second external terminal 20, and external control terminal 40 (hereinafter, these three external connection terminals are also collectively referred to as external non-resistance terminals) included in the semiconductor device. That is to say, it can be said that the heat dissipation effect is greater when the total number of external resistance terminals 30, which are substantial, dispersed heat sources, is greater. For the sake of simplicity in examination, the external connection terminals are assumed to be arranged in a matrix on the surface of the semiconductor device, and the case of four terminals in a matrix of two rows and two columns is examined as the minimum external connection terminal configuration. In such a case, consistency can be ensured by applying a later-described configuration in which second external terminal 20 is not included, and providing two external resistance terminals 30 and two external non-resistance terminals (first external terminal 10 and external control terminal 40). In that case, external resistance terminals 30 are disposed (at the same time, first resistor elements 110 adjacent to external resistance terminals 30 are also disposed) in a region occupying about a half of the plan-view surface area of the semiconductor device. In conventional semiconductor devices, (when the plan-view surface area of the semiconductor device is examined based on the ratio, in terms of total numbers, between external connection terminals that each occupy a portion of the surface area of the semiconductor device,) the total number of external connection terminals is four and the total number of external resistance terminals adjacent to which resistor elements for discharge current control are disposed is one. Therefore, also in this case, it is possible to reduce the maximum temperature of heat generated at the time of current conduction, and dissipate heat efficiently.

In the above-described case of semiconductor device 1, since the total number of external connection terminals is nine and the total number of external resistance terminals 30 is six, external resistance terminals 30 are disposed in a region of about ⅔ the plan-view surface area of semiconductor device 1. Accordingly, it is possible to further reduce the maximum temperature of heat generated at the time of current conduction, and dissipate heat more efficiently.

Figure 5:
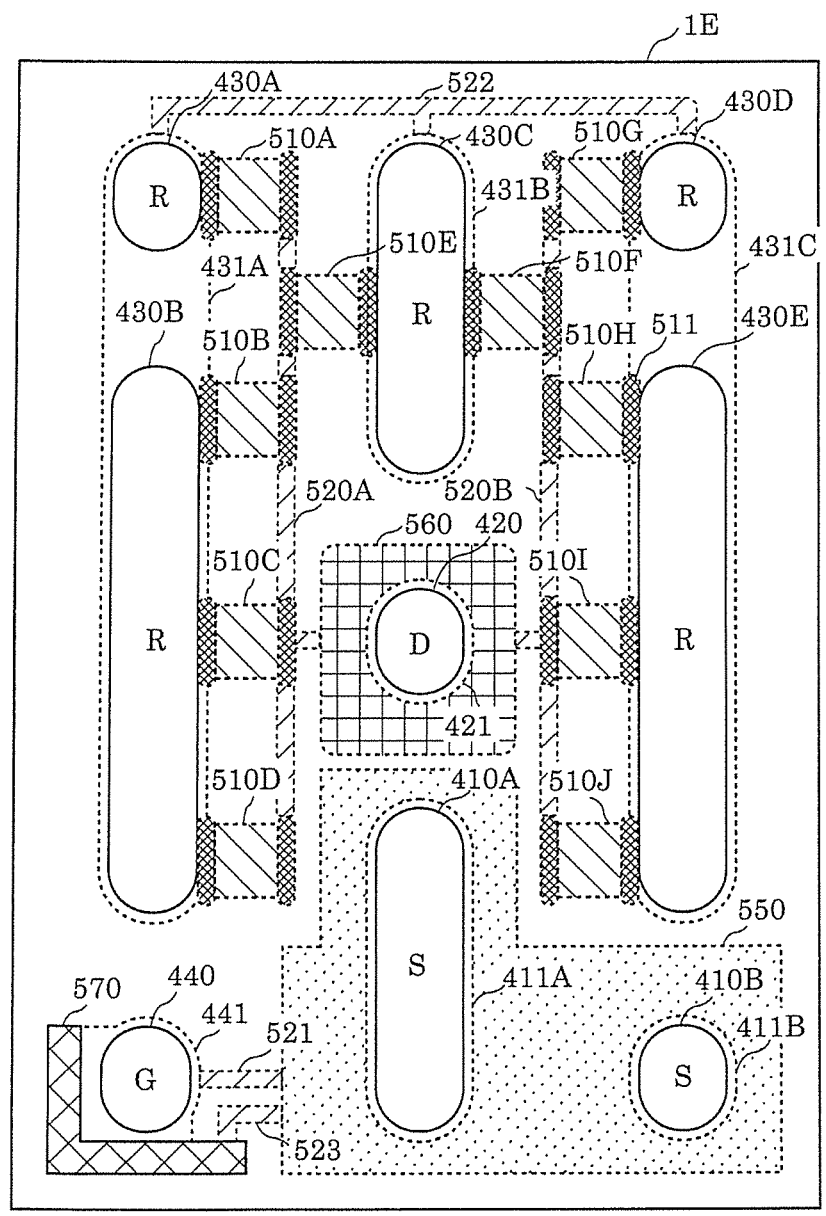
FIG. 5 is a top transparent view of a semiconductor device according to the embodiment.
Figure 6:
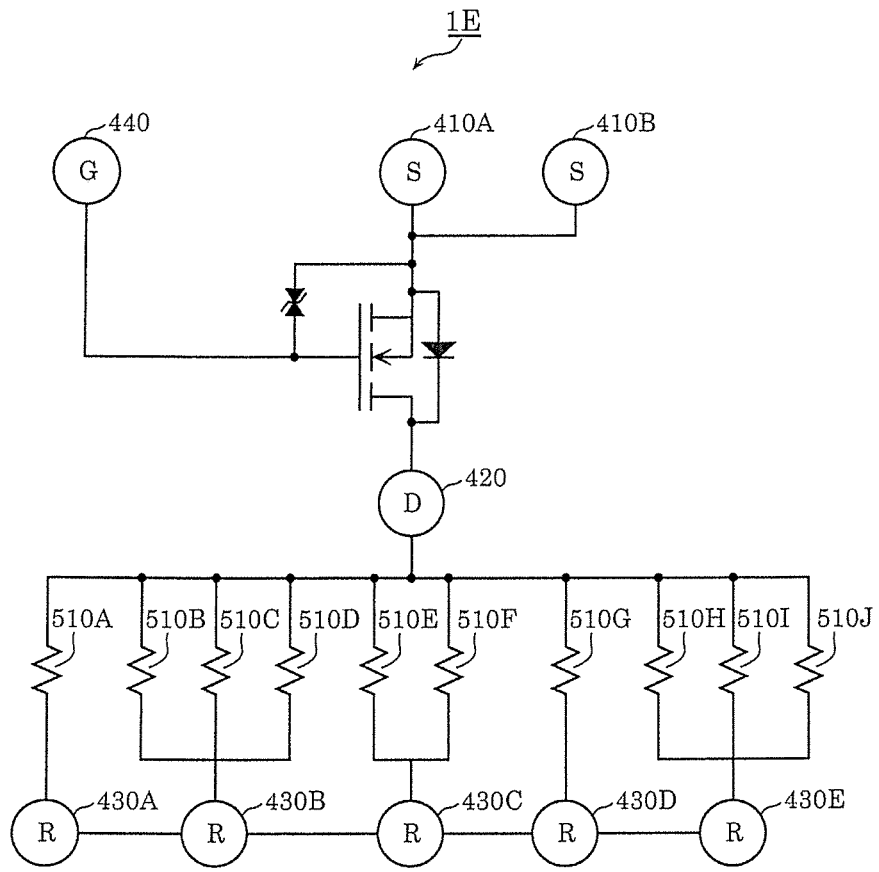
FIG. 6 is a circuit diagram of a semiconductor device according to the embodiment.

Configuration in which First Resistor Elements and External Resistance Terminals do not Correspond One-to-One with Each Other FIG. 5 is a top transparent view of semiconductor device 1E according to the present embodiment, and FIG. 6 is a circuit diagram of semiconductor device 1E.

The following describes semiconductor device 1E with a focus on the differences from semiconductor device 1. Structural elements of semiconductor device 1E that are common to semiconductor device 1 are given the same reference signs and the detailed description thereof is omitted since they have already been described.

In FIG. 5 and FIG. 6, first external terminals 410A and 410B, second external terminal 420, external resistance terminals 430A to 430E, and external control terminal 440 are external connection terminals identical to first external terminal 10, second external terminal 20, external resistance terminals 30, and external control terminal 40 of semiconductor device 1, respectively, except for their shapes.

External resistance terminals 430 are radially disposed around second external terminal 420 in a plan view of semiconductor device 1E.

First resistor elements 510 are resistor elements identical to first resistor elements 110 of semiconductor device 1, and are radially disposed around second external terminal 420 in the plan view of semiconductor device 1E.

In the plan view of semiconductor device 1E, second external terminal 420 is disposed closer to the central portion of semiconductor device 1E than the other external connection terminals are.

First electrodes 411A and 411B, drain external electrode 421, resistance electrodes 431A to 431C, and third electrode 441 are identical to first electrode 11, drain external electrode 21, resistance electrodes 31, and third electrode 41 of semiconductor device 1, respectively, except for their shapes.

Transistor element region 550, drain lead-out region 560, and Zener diode region 570 are regions identical to transistor element region 150, drain lead-out region 160, and Zener diode region 170 of semiconductor device 1, respectively.

Metal wires 520A and 520B, 521, 522, and 523 are identical to metal wires 120, 121, 122, and 123 of semiconductor device 1, respectively, and contacts 511 are identical to contacts 111 of semiconductor device 1.

As illustrated in FIG. 6, semiconductor device 1E is an example case in which the total number of first resistor elements 510 is ten, the total number of external resistance terminals 430 is five, and the total number of resistance electrodes 431 is three; that is, first resistor elements 510, external resistance terminals 430, and resistance electrodes 431 do not correspond one-to-one with each other. Specifically, first resistor element 510A and external resistance terminal 430A correspond to each other, first resistor elements 510B to 510D and external resistance terminal 430B correspond to each other, first resistor elements 510E and 510F and external resistance terminal 430C correspond to each other, first resistor element 510G and external resistance terminal 430D correspond to each other, and first resistor elements 510H to 510J and external resistance terminal 430E correspond to each other. The relationship between first resistor elements 510 and resistance electrodes 431 is that resistance electrode 431A and first resistor elements 510A to 510D are physically connected via contacts 511, resistance electrode 431B and first resistor elements 510E and 510F are physically connected via contacts 511, and resistance electrode 431C and first resistor elements 510G to 510J are physically connected via contacts 511.

As with semiconductor device 1, semiconductor device 1E configured as described above also can reduce the maximum temperature of heat generated at the time of current conduction, and dissipate heat efficiently.

Moreover, the shapes of external resistance terminals 430B, 430C, and 430E are oval in plan view, and thus have larger terminal surface areas than circular external resistance terminals do, and therefore can more efficiently dissipate heat.

Configuration Including Horizontal MOS Transistor

Although semiconductor device 1 described above includes transistor element 100 that is a vertical MOS transistor, the semiconductor devices according to the present embodiment are not limited to the configuration in which the transistor element is a vertical MOS transistor.

Figure 7:
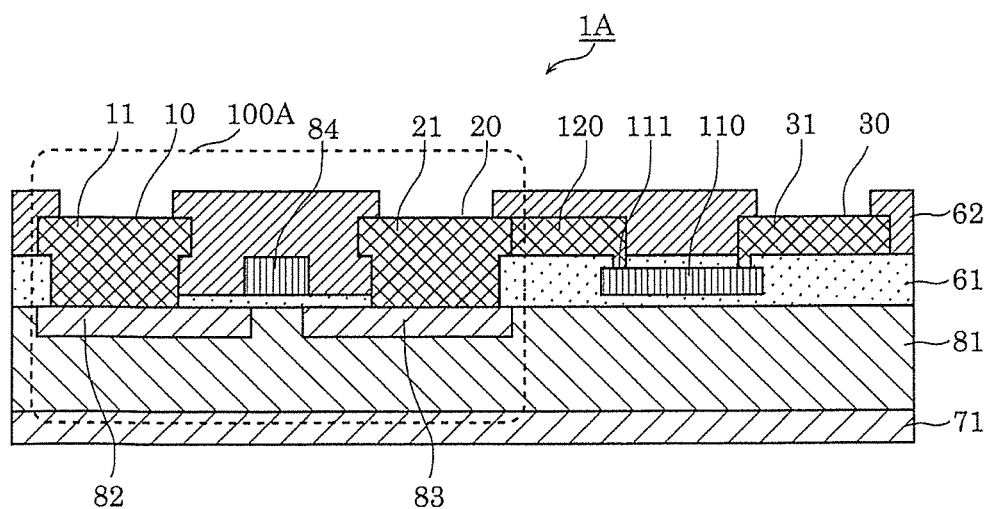
FIG. 7 is a cross-sectional view of a semiconductor device according to the embodiment.

FIG. 7 is a cross-sectional view of semiconductor device 1A according to the present embodiment.

Semiconductor device 1A is configured by replacing transistor element 100 of semiconductor device 1 which is a vertical MOS transistor with transistor element 100A which is a horizontal MOS transistor.

The following describes semiconductor device 1A with a focus on the differences from semiconductor device 1. Structural elements of semiconductor device 1A that are common to semiconductor device 1 are given the same reference signs and the detailed description thereof is omitted since they have already been described.

The external appearance of semiconductor device 1A is the same as that of semiconductor device 1 illustrated in FIG. 1. Semiconductor device 1A includes first external terminal 10, second external terminal 20, external resistance terminals 30, external control terminal 40, first resistor elements 110, and Zener diode 190 for ESD protection at positions identical to the positions of these elements in semiconductor device 1 illustrated in FIG. 3.

As illustrated in FIG. 7, semiconductor device 1A includes semiconductor substrate 81, insulating layer 61, passivation layer 62, metal layer 71, transistor element 100A, resistance electrodes 31, first resistor elements 110, and metal wires 120.

Semiconductor substrate 81 comprises silicon containing an impurity of the second conductivity type, and may be, for example, a P-type silicon substrate. Here, the first conductivity type is N-type and the second conductivity type is P-type.

Transistor element 100A includes first electrode 11, drain external electrode 21, gate conductor 84, source internal electrode 82, and drain internal electrode 83.

Source internal electrode 82 is a diffusion layer of the first conductivity type formed inside semiconductor substrate 81, and is physically connected to first electrode 11. Source internal electrode 82 may be formed by, for example, implanting an impurity of the first conductivity type into a partial region of semiconductor substrate 81.

Drain internal electrode 83 is a diffusion layer of the first conductivity type formed inside semiconductor substrate 81, and is physically connected to drain external electrode 21. Drain internal electrode 83 may be formed by, for example, implanting an impurity of the first conductivity type into a partial region of semiconductor substrate 81.

Gate conductor 84 is in contact with the top surface of film-like insulating layer 61 on semiconductor substrate 81, and is formed between source internal electrode 82 and drain internal electrode 83 in a plan view of semiconductor device 1A. Gate conductor 84 comprises polysilicon implanted with an impurity of the first conductivity type, and is electrically connected to third electrode 41 (see FIG. 3) via metal wire 121. Gate conductor 84 is a control electrode identical to gate conductors 55 of semiconductor device 1.

As with semiconductor device 1, semiconductor device 1A configured as described above can pass a current from external resistance terminals 30 to first external terminal 10 when transistor element 100A is in a conductive state. The current path at this time is, in order from external resistance terminals 30 to first external terminal 10, resistance electrodes 31, first resistor elements 110, metal wires 120, drain external electrode 21, drain internal electrode 83, semiconductor substrate 81, source internal electrode 82, and first electrode 11.

Although semiconductor device 1A described above has a configuration in which the first conductivity type is N-type and the second conductivity type is P-type, the semiconductor devices according to the present embodiment are not limited to this configuration, and may have a configuration in which the first conductivity type is the P-type and the second conductivity type is N-type.

Configuration Including Second Resistor Element

Although semiconductor device 1 described above includes the first resistor element in the conduction current path, the semiconductor devices according to the present embodiment may further include a second resistor element.

Figure 8:
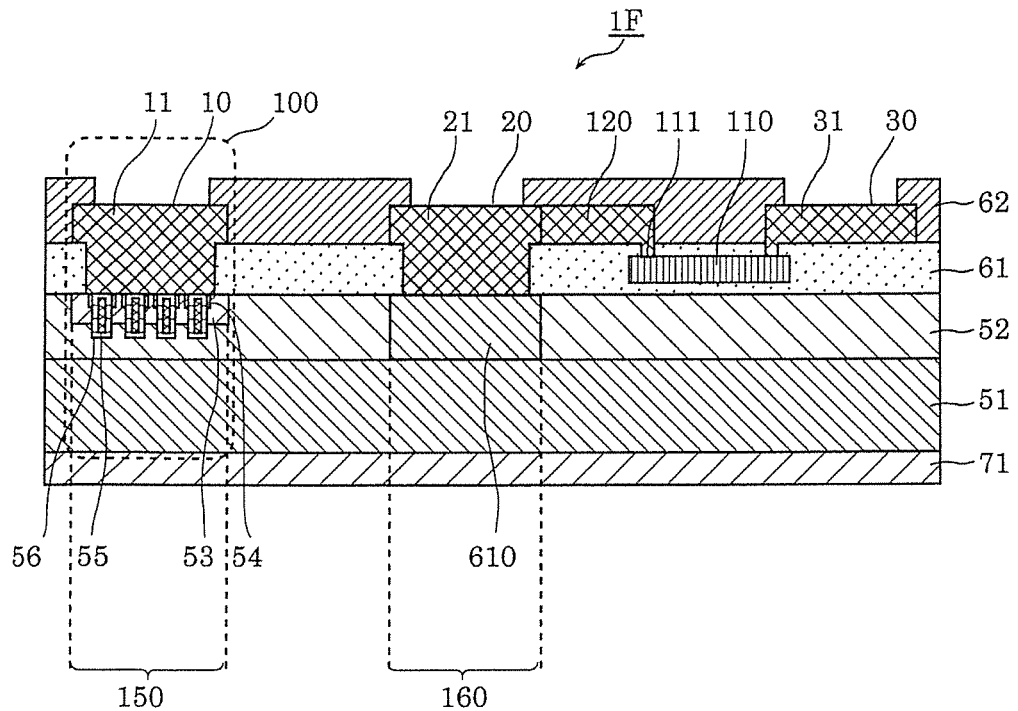
FIG. 8 is a cross-sectional view of a semiconductor device according to the embodiment.

FIG. 8 is a cross-sectional view of vertical MOS transistor type semiconductor device 1F according to the present embodiment.

The following describes semiconductor device 1F with a focus on the differences from semiconductor device 1. Structural elements of semiconductor device 1F that are common to semiconductor device 1 are given the same reference signs and the detailed description thereof is omitted since they have already been described.

As illustrated in FIG. 8, semiconductor device 1F is configured by replacing high-concentration impurity layer 57 of semiconductor device 1 with second resistor element 610.

Second resistor element 610 is formed on and physically connected to semiconductor substrate 51 or first low-concentration impurity layer 52, and is a second low-concentration impurity layer containing an impurity of the first conductivity type in a lower concentration than the concentration of the impurity of the first conductivity type in semiconductor substrate 51. Since second resistor element 610 is formed below and physically connected to drain external electrode 21, there is no increase in the surface area of semiconductor device 1F caused by the addition of second resistor element 610. Second resistor element 610 may comprise polysilicon containing an impurity.

The conduction current path of semiconductor device 1F is, in order from external resistance terminals 30 to first external terminal 10, resistance electrodes 31, first resistor elements 110, metal wires 120, drain external electrode 21, second resistor element 610, semiconductor substrate 51, first low-concentration impurity layer 52, body region 53, source regions 54, and first electrode 11. At the time of current conduction, heat is generated both at first resistor elements 110 and second resistor element 610, which means that the locations at which heat is generated are more dispersed than in semiconductor device 1. As a result, the maximum temperature of heat generated at the time of current conduction can be further reduced, and heat can be dissipated more efficiently.

Desirably, the resistance values of first resistor elements 110 are identical, and are each a value obtained by multiplying the resistance value of second resistor element 610 by the total number of first resistor elements 110. With this, the amount of heat generated due to the resistance value of each first resistor element 110 becomes equal to the amount of heat generated by second resistor element 610, thus allowing the maximum temperatures of heat generated by each first resistor element 110 and second resistor element 610 to be uniform at a minimum value.

Figure 9:
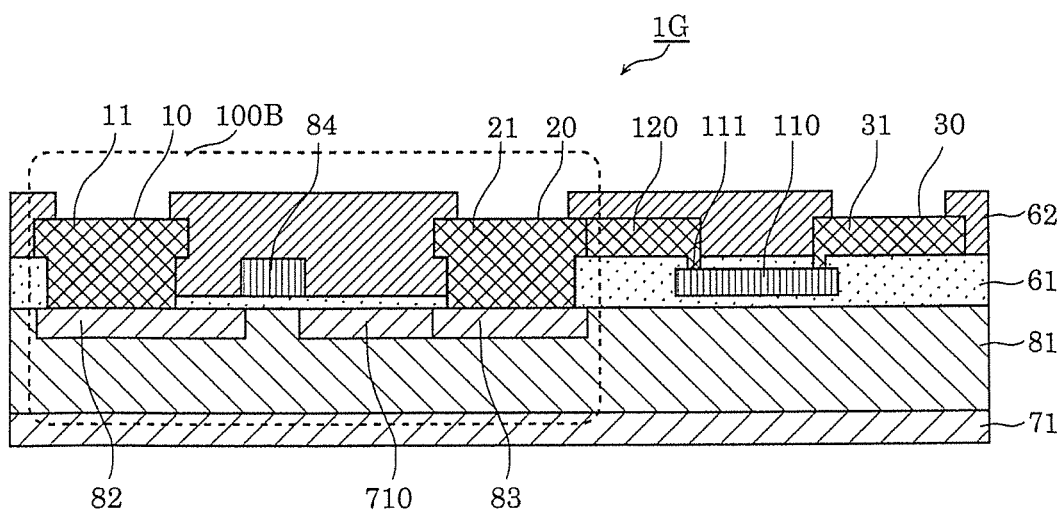
FIG. 9 is a cross-sectional view of a semiconductor device according to the embodiment.

FIG. 9 is a cross-sectional view of horizontal MOS transistor type semiconductor device 1G according to the present embodiment.

The following describes semiconductor device 1G with a focus on the differences from semiconductor device 1A. Structural elements of semiconductor device 1G that are common to semiconductor device 1A are given the same reference signs and the detailed description thereof is omitted since they have already been described.

As illustrated in FIG. 9, semiconductor device 1G is configured by adding second resistor element 710 to semiconductor device 1A.

Second resistor element 710 is formed between drain internal electrode 83 inside semiconductor substrate 81 and the portion directly below gate conductor 84, is formed on a side of drain internal electrode 83 where source internal electrode 82 is provided, and is in contact with drain internal electrode 83. Second resistor element 710 is a low concentration impurity layer containing an impurity of the first conductivity type in a lower concentration than the concentration of the impurity of the first conductivity type in drain internal electrode 83.

The conduction current path of semiconductor device 1G is, in order from external resistance terminals 30 to first external terminal 10, resistance electrodes 31, first resistor elements 110, metal wires 120, drain external electrode 21, drain internal electrode 83, second resistor element 710, semiconductor substrate 81, source internal electrode 82, and first electrode 11. At the time of current conduction, heat is generated both at first resistor elements 110 and second resistor element 710, which means that the locations at which heat is generated are more dispersed than in semiconductor device 1A. As a result, the maximum temperature of heat generated at the time of current conduction can be further reduced, and heat can be dissipated more efficiently.

Desirably, the resistance values of first resistor elements 110 are identical, and are each a value obtained by multiplying the resistance value of second resistor element 710 by the total number of first resistor elements 110. With this, the amount of heat generated due to the resistance value of each first resistor element 110 becomes equal to the amount of heat generated by second resistor element 710, thus allowing the maximum temperatures of heat generated by each first resistor element 110 and second resistor element 710 to be uniform at a minimum value.

Although second resistor element 710 in semiconductor device 1G having the above configuration is additionally formed on a side of drain internal electrode 83 where source internal electrode 82 is provided, and is in contact with drain internal electrode 83, second resistor element 710 may be provided at the position of drain internal electrode 83 to replace drain internal electrode 83.

Configuration in which Second External Terminal is Not Included

Although semiconductor device 1F described above includes second external terminal 20, the semiconductor devices according to the present embodiment are not limited to the configuration including second external terminal 20.

Figure 10:
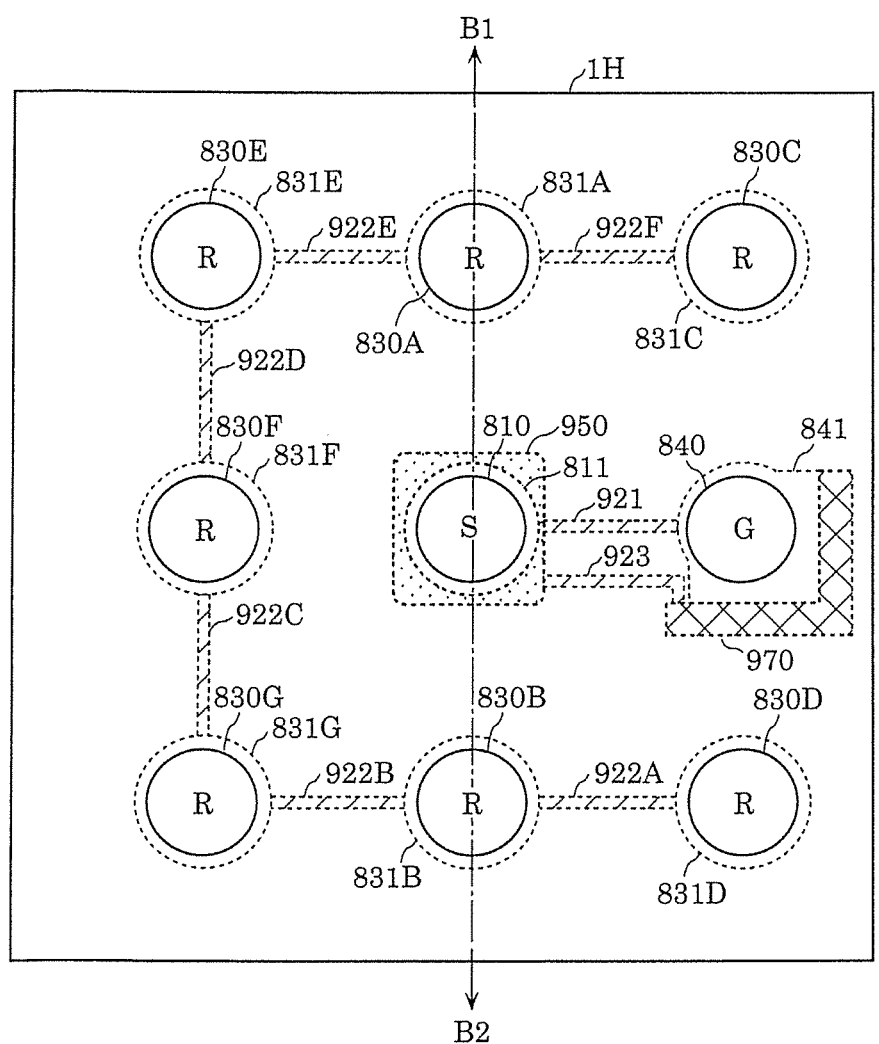
FIG. 10 is a top transparent view of a semiconductor device according to the embodiment.

FIG. 10 is a top transparent view of semiconductor device 1H.

The following describes semiconductor device 1H with a focus on the differences from semiconductor device 1F. Structural elements of semiconductor device 1H that are common to semiconductor device 1F are given the same reference signs and the detailed description thereof is omitted since they have already been described.

In FIG. 10, first external terminal 810, external resistance terminals 830A to 830G (hereinafter also referred to as external resistance terminals 830), and external control terminal 840 are external connection terminals identical to first external terminal 10, external resistance terminals 30, and external control terminal 40 of semiconductor device 1F, respectively.

First electrode 811, resistance electrodes 831A to 831G (hereinafter also referred to as resistance electrodes 831), and third electrode 841 are identical to first electrode 11, resistance electrodes 31, and third electrode 41 of semiconductor device 1F, respectively.

Transistor element region 950 and Zener diode region 970 are identical to transistor element region 150 and Zener diode region 170 of semiconductor device 1F, respectively.

Metal wires 921, 922A to 922F, and 923 are identical to metal wires 121, 122, and 123 of semiconductor device 1F, respectively.

As illustrated in FIG. 10, semiconductor device 1H includes one more external resistance terminal 830 since second external terminal 20 included in semiconductor device 1F is not included in semiconductor device 1H.

Figure 11:
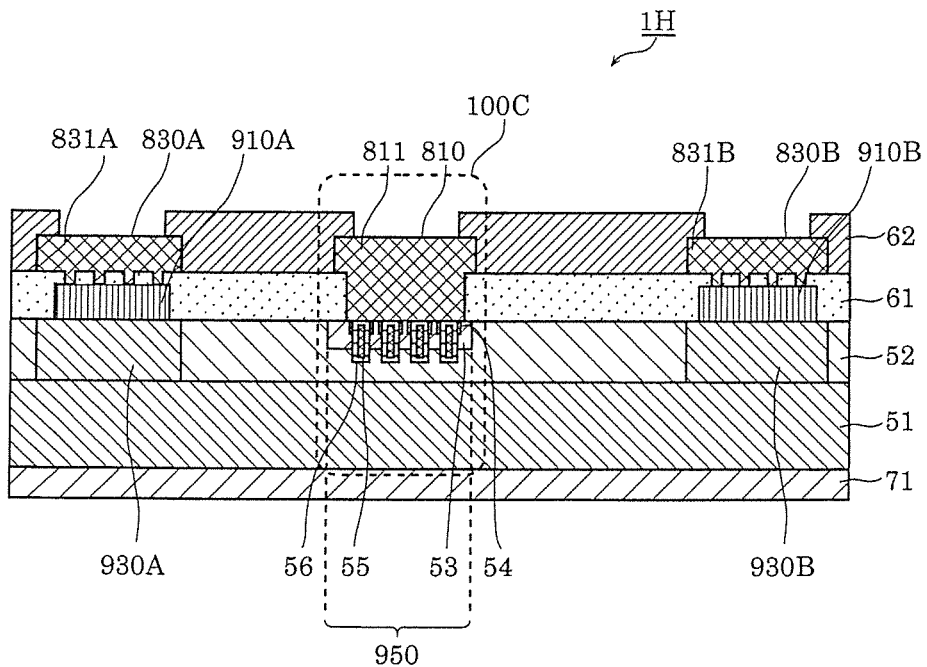
FIG. 11 is a cross-sectional view of a semiconductor device according to the embodiment.

FIG. 11 is a cross-sectional view of semiconductor device 111 illustrating the plane taken along line B1-B2 in FIG. 10.

As illustrated in FIG. 11, semiconductor device 1H includes semiconductor substrate 51, first low-concentration impurity layer 52, insulating layer 61, passivation layer 62, metal layer 71, transistor element 100C, and resistance electrodes 831 (only 831A and 831B among 831A to 831G are illustrated in FIG. 11), first resistor elements 910 (only 910A and 910B among 910A to 910G are illustrated in FIG. 11), and second resistor elements 930 (only 930A and 930B among 930A to 930G are illustrated in FIG. 11).

Transistor element 100C is identical to transistor element 100 of semiconductor device 1F except that first electrode 11 and first external terminal 10 included in transistor element 100 are replaced with first electrode 811 and first external terminal 810, respectively.

As with first resistor elements 110 of semiconductor device 1F, first resistor elements 910 are resistor elements which comprise polysilicon implanted with an impurity.

As with second resistor element 610 of semiconductor device 1F, second resistor elements 930 are second low-concentration impurity layers.

Semiconductor device 1H includes first resistor elements 910 which are formed below resistance electrodes 831 and have second electrodes physically connected to resistance electrodes 831. Semiconductor device 1H further includes second resistor elements 930 which are formed below first resistor elements 910, have second electrodes physically connected to first electrodes of first resistor elements 910, and have first electrodes physically connected to semiconductor substrate 51.

Semiconductor device 1H includes seven resistance electrodes 831, seven first resistor elements 910, and seven second resistor elements 930 which correspond one-to-one with each other.

The conduction current path of semiconductor device 1H is, in order from external resistance terminals 830 to first external terminals 810, resistance electrodes 831, first resistor elements 910, second resistor elements 930, semiconductor substrate 51, first low-concentration impurity layer 52, body region 53, source regions 54, and first electrode 811.

As described above, semiconductor device 1H does not include second external terminal 20, but instead includes one more external resistance terminal 830 than semiconductor device 1F does. As a result, the maximum temperature of heat generated at the time of current conduction can be further reduced, and heat can be dissipated more efficiently. Moreover, in such a case, a configuration in which external resistance terminals 830 are provided at all the four corners of semiconductor device 1H in a plan view of semiconductor device 1H is desirable for dispersed heat dissipation. Furthermore, in such a case, it is desirable to dispose first external terminal 810 closer to the central portion than the other external connection terminals are, in order to achieve dispersed heat dissipation in a well-balanced manner in semiconductor device 1H.

Although semiconductor device 1H described above includes a plurality of second resistor elements 930 corresponding one-to-one with first resistor elements 910, the semiconductor devices according to the present embodiment are not limited to the configuration which includes a plurality of second resistor elements 930 or the configuration in which a plurality of second resistor elements 930 correspond one-to-one with first resistor elements 910. Single second resistor element 930 may correspond to a plurality of first resistor elements 910. It is sufficient so long as at least one second resistor element 930 is included, and a total number of second resistor elements 930 need not be identical to a total number of first resistor elements 910.

The semiconductor devices according to the present embodiment need not include second resistor elements 930, and may include first low-concentration impurity layer 52 of semiconductor device 1F or high-concentration impurity layer 57 of semiconductor device 1 instead of second resistor elements 930. Even in such cases, since second external terminal 20 is not included and one more external resistance terminal 830 is included, it is possible to further reduce the maximum temperature of heat generated at the time of current conduction and dissipate heat more efficiently.

Variations of Resistance Electrodes and First Resistor Elements

Although semiconductor devices 1, 1A, 1F, and 1G described above have configurations in which external resistance terminals 30 and first resistor elements 110 are disposed at the positions illustrated in FIG. 3 or FIG. 5, the semiconductor devices according to the present embodiment are not limited to such configurations.

Figure 12:
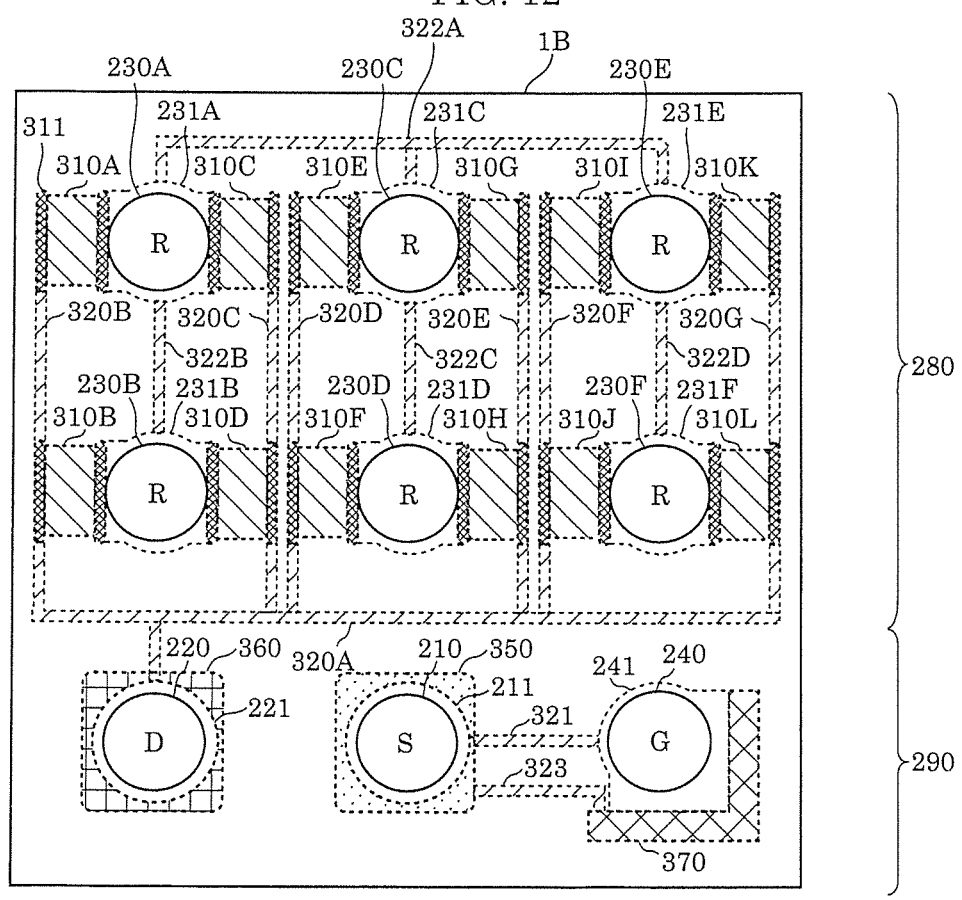
FIG. 12 is a top transparent view of a semiconductor device according to the embodiment.

FIG. 12 is a top transparent view of semiconductor device 1B according to the embodiment.

The following describes semiconductor device 1B with a focus on the differences from semiconductor device 1. Structural elements of semiconductor device 1B that are common to semiconductor device 1 are given the same reference signs and the detailed description thereof is omitted since they have already been described.

In FIG. 12, first external terminal 210, second external terminal 220, external resistance terminals 230A to 230F (hereinafter also referred to as external resistance terminals 230), and external control terminal 240 are external connection terminals identical to first external terminal 10, second external terminal 20, external resistance terminals 30, and external control terminal 40 of semiconductor device 1, respectively.

First resistor elements 310A to 310L are identical to first resistor elements 110 of semiconductor device 1.

First electrode 211, drain external electrode 221, resistance electrodes 231A to 231F, and third electrode 241 are identical to first electrode 11, drain external electrode 21, resistance electrodes 31, and third electrode 41 of semiconductor device 1, respectively.

Transistor element region 350, drain lead-out region 360, and Zener diode region 370 are identical to transistor element region 150, drain lead-out region 160, and Zener diode region 170 of semiconductor device 1, respectively.

Metal wires 320A to 320G, 321, 322A to 322D, and 323 are identical to metal wires 120, 121, 122, and 123 of semiconductor device 1, respectively, and contacts 311 are identical to contacts 111 of semiconductor device 1.

As illustrated in FIG. 12, external resistance terminals 230 are arranged in a matrix in first terminal region 280 which occupies about ⅔ of the plan-view surface area of semiconductor device 1B, whereas first external terminal 210, second external terminal 220, and external control terminal 240 (hereinafter, these three external connection terminals are also collectively referred to as external non-resistance terminals 2) are arranged in a line in second terminal region 290 which occupies about ⅓ of the plan-view surface area of semiconductor device 1B. In other words, external non-resistance terminals 2 are not disposed in the terminal lines in which external resistance terminals 230 are disposed, and external resistance terminals 230 are not disposed in the terminal line in which external non-resistance terminals 2 are disposed.

Figure 13:
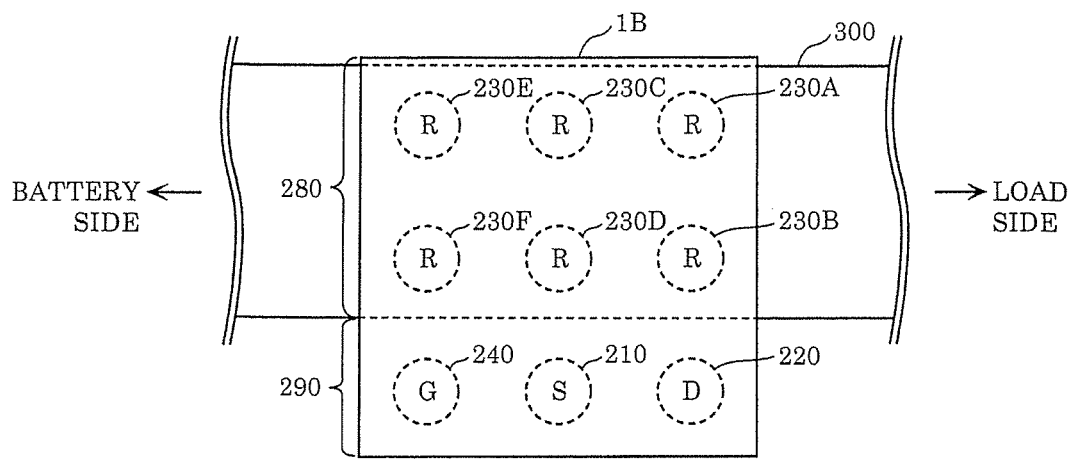
FIG. 13 is a schematic view illustrating mounting of a semiconductor device according to the embodiment.

FIG. 13 is a schematic diagram illustrating an example of facedown mounting of semiconductor device 1B on the mounting substrate on which a charge/discharge circuit illustrated in FIG. 15, which is described later, is to be mounted.

Substrate wire 300 is a wire on the high side of the charge/discharge circuit illustrated in FIG. 15, which is described later, and has a straight wiring pattern. Generally, it is desirable that a substrate wire through which a large current flows have a straight wiring pattern avoiding a bent shape, in order to prevent current concentration and reduce the conduction resistance. In semiconductor device 1B described above, all external resistance terminals 230 can be bonded to substrate wire 300 by bringing the direction of the terminal lines in first terminal region 280 in agreement with the wiring direction of substrate wire 300.

Figure 14A:
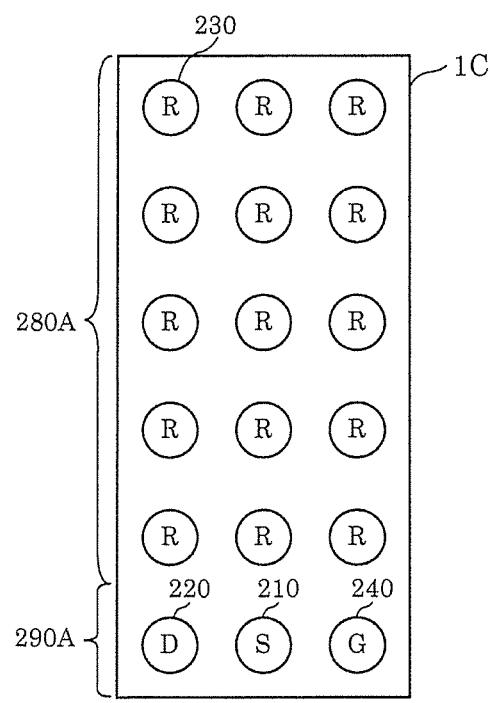
FIG. 14A is a top view of a semiconductor device according to the embodiment.
Figure 14B:
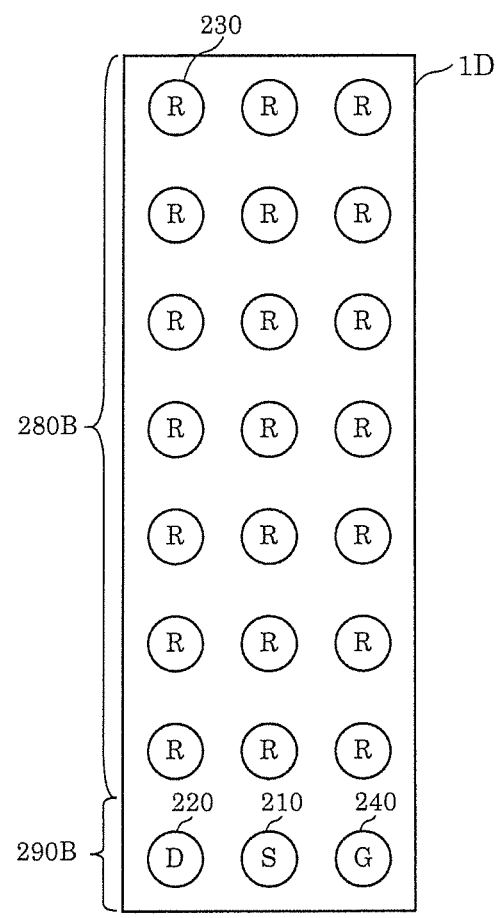
FIG. 14B is a top view of a semiconductor device according to the embodiment.

FIG. 14A and FIG. 14B are top views of semiconductor devices 1C and 1D according to the present embodiment, respectively, which include a greater total number of external resistance terminals 230 than the total number of external resistance terminals 230 in semiconductor device 1B.

In semiconductor devices 1C and 1D: the total number of terminal lines of external connection terminal is 6 and 8, respectively; 15 and 21 external resistance terminals 230 are arranged in a matrix in first terminal regions 280A and 280B which occupy about ⅚ and about ⅞ of the plan-view surface area, respectively; and external non-resistance terminals 2 are arranged in one line in second terimal regions 290A and 290B which occupy about ⅙ and about ⅛ of the plan-view surface area, respectively. When the capacity of battery 1010 in the charge/discharge circuit is large, current discharged by the semiconductor device increases. In order not to exceed the allowable operating temperature of the semiconductor device, it is necessary to increase the total number of external resistance terminals 230 so that the generated heat is more dispersed. Even in such a case, semiconductor devices 1C and 1D described above can be mounted on a mounting substrate having a straight wiring pattern because semiconductor devices 1C and 1D are divided into two regions of first terminal region 280A and second terminal region 290A and two regions of first terminal region 280B and second terminal region 290B, respectively, in the plan view of the semiconductor devices in parallel to one side of semiconductor devices 1C and 1D.

The positional relationship between the first terminal region and the second terminal region is not limited to the relationship in which the semiconductor device is divided into two terminal regions, i.e., one first terminal region and one second terminal region, in the plan view of the semiconductor device in parallel to one side of the semiconductor device. For example, the semiconductor device may be divided into more than two terminal regions, i.e., two or more first terminal regions and one second terminal region in the plan view of the semiconductor device in parallel to one side of the semiconductor device. That is to say, all the external resistance terminals can be mounted on a mounting substrate having a straight wiring pattern, so long as the terminal lines including external resistance terminals include no other external terminals.

In semiconductor device 1B described above, only external resistance terminals 230 are disposed in first terminal region 280; however, second external terminal 220 may be included in first terminal region 280. In such a case, in an application circuit in which second external terminal 220, which is one of the external connection terminals of semiconductor device 1B, is not used, second external terminal 220 need not be bonded to the mounting substrate at the time of mounting semiconductor device 1B on the mounting substrate.

Application Example

Figure 15:
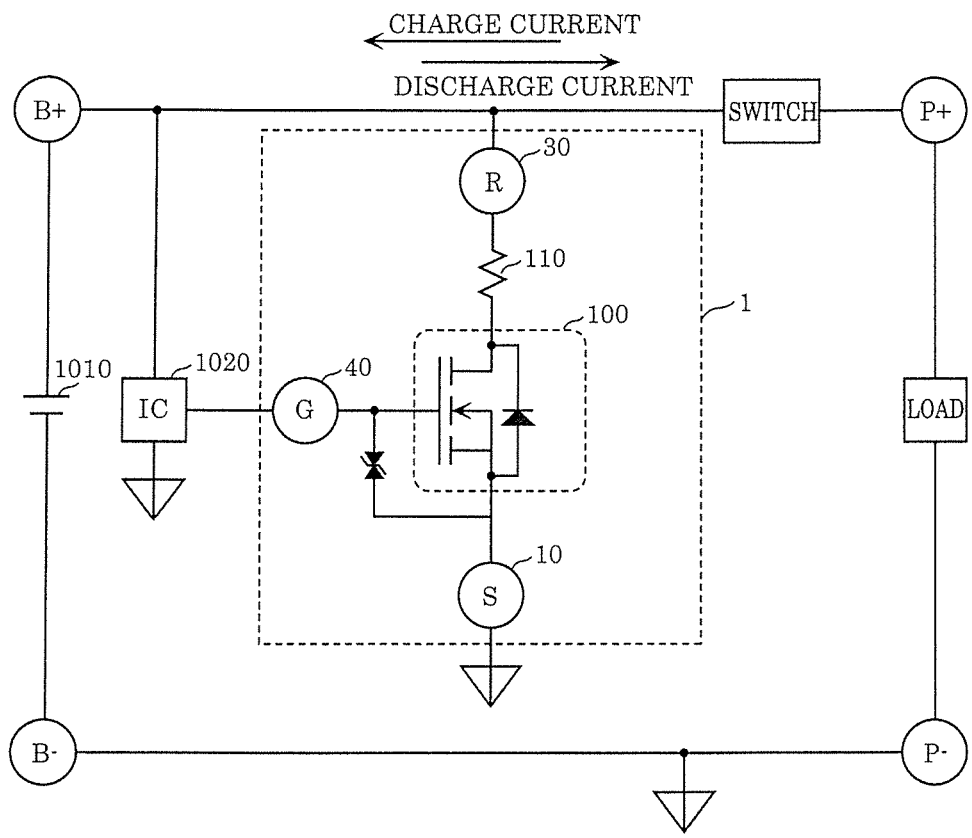
FIG. 15 is a schematic view of a charge/discharge circuit according to the embodiment.

FIG. 15 illustrates a charge/discharge circuit of a battery for a smartphone, for example, and illustrates, as an application example, a case where semiconductor device 1 is provided on the high side of the charge/discharge circuit and used as a discharge circuit which instantaneously discharges battery 1010.

In response to a control signal supplied from control IC 1020, semiconductor device 1 instantaneously places transistor element 100 in a conductive state so as to instantaneously discharge battery 1010. By examining the behavior of the voltage of battery 1010 after discharged, the degree of consumption of battery 1010 can be estimated. At the time of instantaneous discharge, a relatively large current of 1A or greater, for example, flows through semiconductor device 1.

Assuming the charge/discharge circuit illustrated in FIG. 15, the inventors simulated temperature transition of semiconductor device 1 operated under a specified power consumption condition for a period of 100 ms while mounted on a glass epoxy substrate of 34 mm×2.5 mm×0.4 mm which is equivalent in size to a battery module substrate of a smartphone. Specifically, the peak temperature value in the temperature transition during discharge operation was determined under plural volume conditions of semiconductor device 1.

Figure 16:
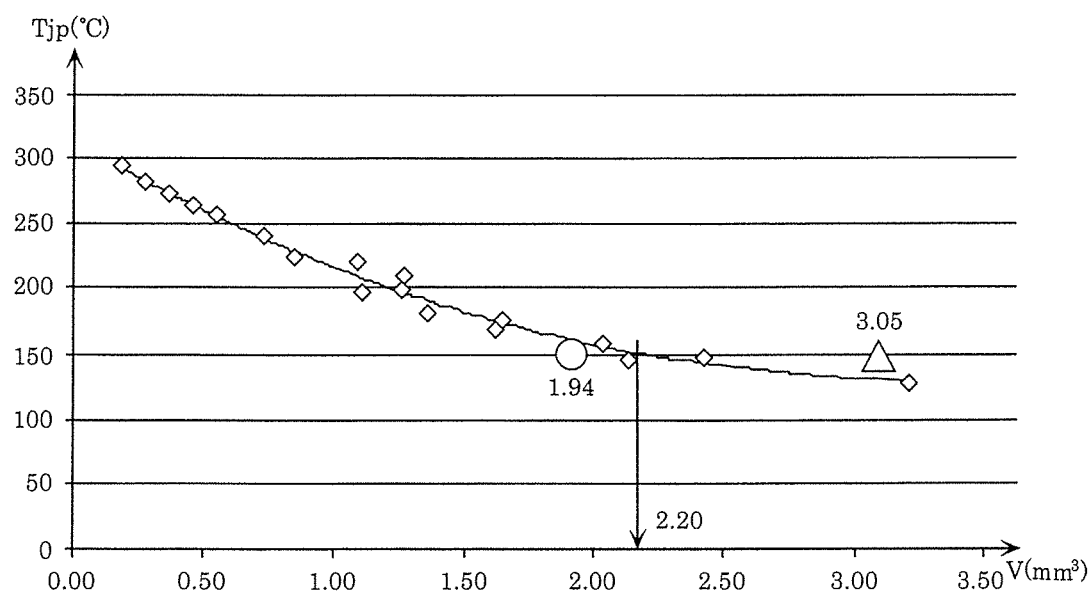
FIG. 16 illustrates a result of temperature simulation for a semiconductor device according to the embodiment.

FIG. 16 illustrates results of the simulation.

In FIG. 16, the vertical axis represents peak temperature value Tjp and the horizontal axis represents volume V, and the rhombi represent the result when the mounting substrate is a single-layered metal substrate and the power consumption condition is 6.16 W, the circle represents the result when the mounting substrate is a three-layered metal substrate and the power consumption condition is 7.04 W, and the triangle represents the result when the mounting substrate is a three-layered metal substrate and the power consumption condition is 9.02 W.

These results show that, since at the start of the conduction operation of transistor element 100, heat generated in semiconductor device 1 is more accumulated in semiconductor device 1 than is dissipated to the mounting substrate, peak temperature value Tjp is considered to depend on volume V and decrease with an increase in volume V.

Moreover, findings obtained from these results are that, in order for peak temperature value Tjp to be less than or equal to an allowable junction temperature of 150° C., volume V of at least 2.20 mm$^3$ is sufficient when the mounting substrate is a single-layered metal substrate and the power consumption condition is 6.16 W, volume V of at least 1.94 mm$^3$ is sufficient when the mounting substrate is a three-layered metal substrate and the power consumption condition is 7.04 W, and volume V of at least 3.05 mm$^3$ is sufficient when the mounting substrate is a three-layered metal substrate and the power consumption condition is 9.02 W.

Considering the conditions for the configuration of semiconductor device 1 that allow peak temperature value Tjp to be less than or equal to the allowable junction temperature of 150° C. based on the above findings, FIG. 17 illustrates a relationship among X, Y, Z, and V, where X and Y denote the length of one side and the length of the other side of semiconductor device 1, respectively, in the plan view of semiconductor device 1, Z denotes the thickness of semiconductor device 1, and V denotes the volume of semiconductor device 1.

Findings obtained from FIG. 17 are that, in the case where X is 4.4 mm and Y is 2.0 mm, in order for peak temperature value Tjp to be less than or equal to the allowable junction temperature of 150° C., a thickness of at least 250 µm is sufficient for semiconductor device 1 when the mounting substrate is a single-layered metal substrate and the power consumption condition is 6.16 W, and a thickness of at least 350 µm is sufficient for semiconductor device 1 when the mounting substrate is a three-layered metal substrate and the power consumption condition is 9.02 W.

As illustrated in FIG. 15, semiconductor device 1 having the above-described configuration can be used as a discharge circuit that discharges a battery; however, the semiconductor device according to the present embodiment is not limited to a discharge circuit, and can also be used as, for example, a charge circuit that charges a battery. In such a case, a charge circuit can be realized by: configuring semiconductor device 1 with the P-type as the first conductivity type and the N-type as the second conductivity type; connecting external resistance terminals 30 to the anode-side node of battery 1010; and applying a voltage higher than the anode voltage of the battery to first external terminal 10.

Although the semiconductor devices according to the present embodiment have been described above based on an embodiment, the present disclosure is not limited to the embodiment. Various modifications to the present embodiment conceivable to those skilled in the art, as well as embodiments resulting from combinations of the elements of the different semiconductor devices illustrated may be included within the scope of the present embodiment, so long as they do not depart from the essence of the present disclosure.

For example, the transistor element may be an NPN-type or PNP-type bipolar transistor.

INDUSTRIAL APPLICABILITY

A semiconductor device according to the present application is widely applicable as a device that controls the conduction state of the current path.

REFERENCE MARKS IN THE DRAWINGS 1, 1A-1H semiconductor device
10, 210, 410A, 410B, 810 first external terminal
11, 211, 411A, 411B, 811 first electrode
20, 220, 420 second external terminal
21, 221, 421 drain external electrode
30, 30A-30F, 230, 230A-230F, 430, 430A-430E, 830, 830A-830G external resistance terminal
31, 31A-31F, 231A-231F, 431A-431C, 831, 831A-831G resistance electrode
40, 240, 440, 840 external control terminal
41, 241, 441, 841 third electrode
51, 81 semiconductor substrate
52 first low-concentration impurity layer
53 body region
54 source region
55, 84 gate conductor
56 gate insulating film
57 high-concentration impurity layer
61 insulating layer
62 passivation layer
71 metal layer
82 source internal electrode
83 drain internal electrode
100, 100A-100C transistor element
110, 110A-110F, 310A-310L, 510, 510A-510J, 910, 910A, 910B first resistor element
111, 311, 511 contact 120, 120A-120F, 121, 122, 123, 320A-320G, 321, 322A-322D, 520A, 520B, 521, 522, 523, 921, 922A-922G, 923 metal wire
150, 350, 550, 950 transistor element region
160, 360, 560 drain lead-out region
170, 370, 570, 970 Zener diode region
190 Zener diode
280, 280A, 280B first terminal region
290, 290A, 290B second terminal region
300 substrate wire
610, 710, 930, 930A, 930B second resistor element
1010 battery
1020 control IC

The invention claimed is:

1. A semiconductor device which is a facedown mounting, chip-size-package-type semiconductor device, the semiconductor device comprising:
a transistor element including a first electrode, a second electrode, and a control electrode which controls a conduction state between the first electrode and the second electrode;
a plurality of first resistor elements each of which includes a first electrode and a second electrode, the first electrodes of the plurality of first resistor elements being electrically connected to the second electrode of the transistor element;
one or more external resistance terminals to which the second electrodes of the plurality of first resistor elements are physically connected;
a first external terminal electrically connected to the first electrode of the transistor element; and
an external control terminal electrically connected to the control electrode, wherein:
the one or more external resistance terminals, the first external terminal, and the external control terminal are external connection terminals provided on a surface of the semiconductor device, and
the first electrodes of the plurality of first resistor elements are not electrically connected to the control electrode.

2. The semiconductor device according to claim 1, wherein
the one or more external resistance terminals are two or more external resistance terminals which are disposed in a region occupying at least a half of a plan-view surface area of the semiconductor device.

3. The semiconductor device according to claim 1, wherein
the second electrodes of the plurality of first resistor elements are electrically short- circuited to each other in the semiconductor device.

4. The semiconductor device according to claim 1, wherein
resistance values of the plurality of first resistor elements are identical.

5. The semiconductor device according to claim 1, further comprising:
a second external terminal on the surface of the semiconductor device, the second external terminal being electrically connected to the second electrode of the transistor element, wherein
the one or more external resistance terminals are two or more external resistance terminals which are radially disposed around the second external terminal in a plan view of the semiconductor device.

6. The semiconductor device according to claim 1, further comprising:
a second external terminal on the surface of the semiconductor device, the second external terminal being electrically connected to the second electrode of the transistor element, wherein
the plurality of first resistor elements are radially disposed around the second external terminal in a plan view of the semiconductor device.

7. The semiconductor device according to claim 1, further comprising:
a second external terminal on the surface of the semiconductor device, the second external terminal being electrically connected to the second electrode of the transistor element; and
a second resistor element in a current path between the second external terminal and the first electrode of the transistor element.

8. The semiconductor device according to claim 7, wherein
the transistor element is a vertical transistor including:
a semiconductor substrate which comprises silicon containing an impurity of a first conductivity type; and
a first low-concentration impurity layer which is in contact with a top surface of the semiconductor substrate, and contains an impurity of the first conductivity type in a lower concentration than a concentration of the impurity of the first conductivity type in the semiconductor substrate,
the semiconductor substrate serves as the second electrode of the transistor element, and
the second resistor element:
is embedded below a top surface of the first low-concentration impurity layer;
includes a first electrode electrically connected to the second electrode of the transistor element; and
includes a second electrode electrically connected to the second external terminal.

9. The semiconductor device according to claim 1, wherein
the transistor element is a vertical transistor including:
a semiconductor substrate which comprises silicon containing an impurity of a first conductivity type; and
a first low-concentration impurity layer which is in contact with a top surface of the semiconductor substrate, and contains an impurity of the first conductivity type in a lower concentration than a concentration of the impurity of the first conductivity type in the semiconductor substrate, and
the semiconductor substrate serves as the second electrode of the transistor element,
the semiconductor device further comprising:
one or more second resistor elements each of which is embedded below a top surface of the first low-concentration impurity layer, includes a first electrode which is electrically connected to the second electrode of the transistor element, and includes a second electrode which is electrically connected to the first electrode of at least one first resistor element included in the plurality of first resistor elements.

10. The semiconductor device according to claim 9, wherein
the one or more second resistor elements are two or more second resistor elements a total number of which is identical to a total number of the plurality of first resistor elements, the two or more second resistor elements correspond one-to-one with the plurality of first resistor elements, and the second electrode of each of the two or more second resistor elements is electrically connected to the first electrode of a corresponding one of the plurality of first resistor elements which correspond to the two or more second resistor.

11. The semiconductor device according to claim 7, wherein the second resistor element is a semiconductor layer containing an impurity.

12. The semiconductor device according to claim 7, wherein the second resistor element is a polysilicon layer.

13. The semiconductor device according to claim 1, wherein in an arrangement of the external connection terminals in a plan view of the semiconductor device:

the one or more external resistance terminals are not included in a terminal line which includes the first external terminal and the external control terminal; and the first external terminal and the external control terminal are not included in a terminal line which includes the one or more external resistance terminals.

14. The semiconductor device according to claim 1, further comprising:

a second external terminal on the surface of the semiconductor device, the second external terminal being electrically connected to the second electrode of the transistor element, wherein the second external terminal is disposed closer to a central portion of the semiconductor device than the external connection terminals are in a plan view of the semiconductor device, the external connection terminals excluding the second external terminal.

15. The semiconductor device according to claim 1, wherein in a plan view of the semiconductor device, a shortest distance between at least one external resistance terminal included in the one or more external resistance terminals and an outer periphery of the semiconductor device is less than or equal to a shortest distance between at least one first resistor element included in the plurality of first resistor elements and the outer periphery of the semiconductor device the at least one first resistor element being electrically connected to the at least one external resistance terminal.

16. The semiconductor device according to claim 1, wherein in a plan view of the semiconductor device, a shortest distance between a central point of at least one external resistance terminal included in the one or more external resistance terminals and an outer periphery of the semiconductor device is less than or equal to a shortest distance between a central point of at least one first resistor element included in the plurality of first resistor elements and the outer periphery of the semiconductor device, the at least one first resistor element being electrically connected to the at least one external resistance terminal.

17. The semiconductor device according to claim 1, wherein a primary material of the semiconductor device is silicon, and a thickness of the semiconductor device is at least 250 μm.

18. The semiconductor device according to claim 17, wherein the thickness of the semiconductor device is at least 350 μm.

19. The semiconductor device according to claim 1, wherein a primary material of the semiconductor device is silicon, and a volume of the semiconductor device is at least 1.94 mm³.

20. The semiconductor device according to claim 19, wherein the volume of the semiconductor device is at least 2.20 mm³.

21. The semiconductor device according to claim 20, wherein the volume of the semiconductor device is at least 3.05 mm³.

22. The semiconductor device according to claim 1, wherein no external terminal having a potential identical to a potential of the second electrode of the transistor element is provided on the surface of the semiconductor device.

* * * * *